United States Patent [19]
Dobkin

[11] 3,742,377

[45] June 26, 1973

[54] DIFFERENTIAL AMPLIFIER WITH MEANS FOR BALANCING OUT OFFSET TERMS

[75] Inventor: Robert C. Dobkin, Menlo Park, Calif.

[73] Assignee: National Semiconductor Corporation, Santa Clara, Calif.

[22] Filed: July 8, 1971

[21] Appl. No.: 165,796

[52] U.S. Cl. ................ 330/30 D, 330/69, 330/38 R
[51] Int. Cl. ................ H03f 3/68
[58] Field of Search ................ 330/30 D, 38 R; 307/299, 299 A

[56] References Cited

UNITED STATES PATENTS

| | | | |
|---|---|---|---|
| 3,340,406 | 9/1967 | Kilby | 307/299 |
| 3,487,376 | 12/1969 | Hart, Jr. | 307/299 X |
| 3,553,659 | 1/1971 | Englund | 307/299 X |
| 3,560,766 | 2/1971 | Moore | 307/299 X |

*Primary Examiner*—Nathan Kaufman
*Attorney*—Lowhurst & Hamrick

[57] ABSTRACT

A differential amplifier comprising a first amplifying circuit including a dual emitter transistor, a second amplifying circuit in parallel with the first amplifying circuit and having a second dual emitter transistor with one of its emitters coupled to one of the emitters of the first transistor and a potentiometer having a resistance element with one end coupled to the other emitter of the first transistor and its other end coupled to the other emitter of the second transistor and its wiper contact coupled to the commonly coupled emitters whereby the collector currents of the first and second transistors can be selectively adjusted by adjusting the potentiometer of the wiper contact relative to the resistance element.

4 Claims, 4 Drawing Figures

INVENTOR
ROBERT C. DOBKIN
BY
Lowhurst & Hamrick
ATTORNEYS

DIFFERENTIAL AMPLIFIER WITH MEANS FOR BALANCING OUT OFFSET TERMS

BACKGROUND OF THE INVENTION

1. Field of the Invention

The present invention relates generally to differential amplifier circuits for integrated circuit applications, and more particularly to differential amplifier circuits using dual emitter transistors as means for balancing out offset voltages caused by slight mismatching of circuit components.

2. Discussion of the Prior Art

One of the problems encountered in manufacturing integrated circuit (IC) differential amplifiers is that of obtaining accurately matched active elements. Typically, even with the close matching obtainable using modern IC techniques, there are likely to be slight differences in the characteristics of the semiconductive regions forming the respective active elements, and these differences have the effect of providing an offset term in the output signal unless compensating means are provided. The offset term is evidenced by a nonzero output signal for a zero input signal.

Heretofore, relatively large value resistances have been used in the load circuits of the respective amplifiers of the differential pair along with an external potentiometer which enables the load impedance in the differential current paths to be selectively altered to balance out the offset potential. This method of balancing out offset terms is disadvantageous in that the internal resistors needed to make adjustment feasible occupy a relatively large area of the chip and are thus costly from the standpoint of optimum chip area utilization. Furthermore, in order to obtain a reasonable adjustment range, large value potentiometers are needed. This is disadvantageous in that large potentiometers are not readily available. They are usually subject to drift and they are typically more sensitive to inaccuracies caused by dirt and moisture.

SUMMARY OF THE PRESENT INVENTION

It is therefore an object of the present invention to provide an improved differential amplifier circuit having means for compensating for offset terms appearing in the output.

Another object of the present invention is to provide an IC differential amplifier using dual emitter transistors in combination with a relatively small external potentiometer to balance out any offset term inherent in the structure.

Still another object of the present invention is to provide an operational amplifier in which dual emitter transistors are utilized as either active load elements or amplifying elements with the purpose of the additional emitters being to allow selective adjustment of the base-to-emitter potentials ($V_{BE}$) of the elements for balancing out offset terms in the output due to the mismatch of circuit components.

In accordance with the present invention, differential amplifier circuits are provided wherein either the active amplifying elements or active load impedances in each amplifying circuit branch are comprised of dual emitter transistors with one of the emitters from each element being coupled to opposite ends of a potentiometer whose wiper contact is coupled to the remaining two emitters. Adjustment of the potentiometer thus enables changes to be effected in the base-to-emitter potentials ($V_{BE}$) and the collector currents of the dual emitter transistors which can be selected to balance out offset terms which would otherwise occur in the output of the amplifier.

One of the primary advantages of the present invention is that it enables a substantial reduction in the chip area required to provide an IC differential amplifier having offset balancing capability.

Another advantage of the present invention is that it provides an IC differential amplifier having adjustable offset balancing capability and one which requires a much smaller balancing potentiometer than is required in related prior art devices.

The novel features which are believed to be characteristic of this invention are set forth with particularity in the appended claims. The invention itself, however, both as to its organization and method of operation together with additional objects and advantages thereof will be best understood from the following description of several preferred embodiments which are illustrated in the several figures of the drawing.

IN THE DRAWING

DESCRIPTION OF THE PREFERRED EMBODIMENTS

Figures 1, 2:
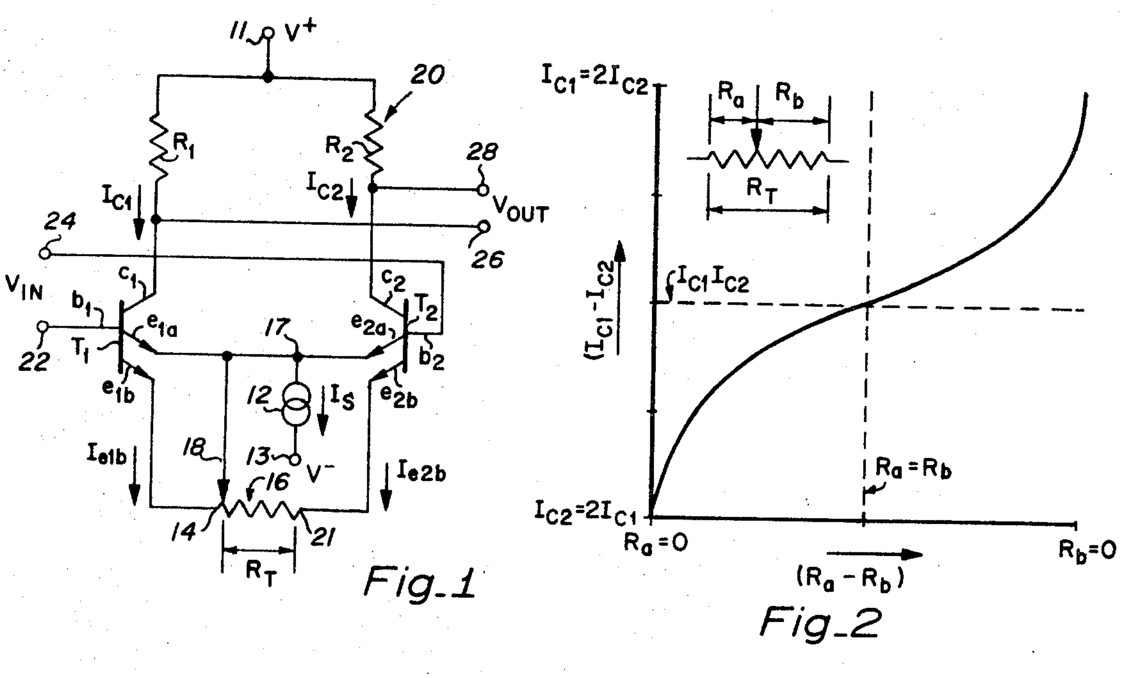
FIG. 1 is a schematic diagram of a differential amplifier in accordance with the present invention.
FIG. 2 is a diagram illustrating the manner in which the collector currents of the FIG. 1 embodiment are altered in response to adjustment of the potentiometer.

Referring now to FIG. 1 of the drawing, there is shown a single stage emitter-coupled differential amplifier comprised of a pair of differentially connected amplifying circuit branches including the dual emitter NPN amplifying transistors $T_1$ and $T_2$, and the equal load resistors $R_1$ and $R_2$. In the first circuit branch 10, which is responsive to a first input signal applied to terminal 22 and referenced to ground, or to a single input signal applied across the input terminals 22 and 24, the collector $c_1$ of transistor $T_1$ is connected through the load resistor $R_1$ to a first source of potential V+ at a terminal 11, and the first emitter $e_{1a}$ of $T_1$ is coupled through a current source 12 to a second source of potential V− at terminal 13. The second emitter $e_{1b}$ of transistor $T_1$ is coupled to the end 14 of a potentiometer 16 having its wiper contact 18 coupled to emitter $e_{1a}$.

Similarly, in the second differential amplifying circuit branch 20, the collector $c_2$ of transistor $T_2$ is coupled through the load resistor $R_2$ to V+ at terminal 11, and the first emitter $e_{2a}$ of $T_2$ is coupled through current source 12 to V− at terminal 13. Emitter $e_{2a}$ is also coupled to emitter $e_{1a}$ of $T_1$ and wiper contact 18. The second emitter $e_{2b}$ of $T_2$ is coupled to the opposite end 21 of potentiometer 16. The bases $b_1$ $T_1$ and $b_2$ of $T_2$ are coupled to the differential input terminals 22 and 24, respectively and the differential output terminals 26 and 28 are coupled to collector $c_1$ and collector $c_2$, respectively.

For a detailed explanation of the operational principles of IC differential amplifiers in general, reference is made to the G.E. Transistor Manual, 7th edition published by the General Electric Company, and the RCA Linear Integrated Circuits Manual, RCA technical series IC–41 published by the Radio Corporation of America.

In order to explain the operation of the circuit shown in FIG. 1, assume for a moment that transistors $T_1$ and $T_2$ are perfectly matched, that resistors $R_1$ and $R_2$ are equal, that the wiper contact 18 of potentiometer 16 is positioned at the leftmost extreme of potentiometer 16 (at point 14) effectively shorting emitter $e_{1a}$ to emitter $e_{1b}$, and the resistance $R_T$ of potentiometer 16 is chosen large enough, i.e., $$\frac{\frac{kT}{q}}{I_s} >> R_T \tag{1}$$

so that when the resistance $R_T$ is in series with one of the emitters $e_{1b}$ and $e_{2b}$, the emitter current from that emitter is insignificant when compared to the other emitter currents. Under these conditions, it can be shown that emitters $e_{1a}$, $e_{1b}$ and $e_{2a}$ are all equally biased, and as a result, their emitter currents are equal, i.e., $$I_{e1a} = I_{e1b} = I_{e2a} \tag{2}$$

Note that the three emitter currents are equal and are added together at node 17, thus the sum of the three emitter currents is equal to the current $I_s$ supplied by current source 12, i.e., $$I_s = I_{e1a} + I_{e1b} + I_{e2a} \tag{3}$$

or $$I_{e1a} = I_s/3 \tag{4}$$

And since the collector currents $I_{c1}$ and $I_{c2}$ are (for high gain transistors ) substantially equal to their emitter currents, then $$I_{c1} = I_{e1a} + I_{e1b} \tag{5}$$

and $$I_{c2} = I_{e2a} + I_{e2b} \tag{6}$$

where $I_{e2b}$ is insignificant. Consequently, from these relationships it follows that when wiper contact 18 is at point 14

$$I_{c2} \cong I_{c1}/2 \tag{7}$$

and when wiper contact 18 is at point 21

$$I_{c1} \cong I_{c2}/2 \ . \tag{8}$$

Similarly, when wiper contact 18 is at the electrical midpoint of potentiometer 16 the portions of $R_T$ in circuit with emitter $e_{1b}$ and $e_{2b}$ respectively, are equal and accordingly, $$I_{e1a} = I_{e2a} \tag{9}$$

and $$I_{e1b} = I_{e2b} \tag{10}$$

and thus, $$I_{c1} = I_{c2} \ . \tag{11}$$

The change in the relative values of $I_{c1}$ and $I_{c2}$, as wiper contact 18 is moved from one side of potentiometer 16 to the other is nonlinear, since the emitter current in a transistor varies logarithmically with a change in the base-to-emitter voltage, and may be illustrated as shown in FIG. 2.

Since the output potential $V_{out}$, taken across terminals 26 and 28, is proportional to the differences in the voltage drops across resistors $R_1$ and $R_2$, it will be seen that by moving wiper contact 18 from the leftmost end of potentiometer 16 to the rightmost end a similar change in output potential can be obtained.

Although these relationships will, of course, vary somewhat where transistor $T_1$ is not precisely matched with transistor $T_2$, and/or $R_1 \neq R_2$, it will be appreciated that since the circuit permits selective adjustment of the collector currents $I_{c1}$ and $I_{c2}$, the positioning of wiper contact 18 can be utilized to balance out any offset potential which occurs at output terminal 26 and 28.

The difference in base-to emitter potential $\Delta V_{BE}$ for a dual emitter transistor such as $T_1$ can be expressed as $$\Delta V_{BE} \cong (kT/q) \ 1n \ (I_{e1a}/I_{e1b}) \ . \tag{12}$$

Thus, with all emitters equal, the adjustment range is 36 mv. (18 mv on each side of the potentiometer).

Figure 3:
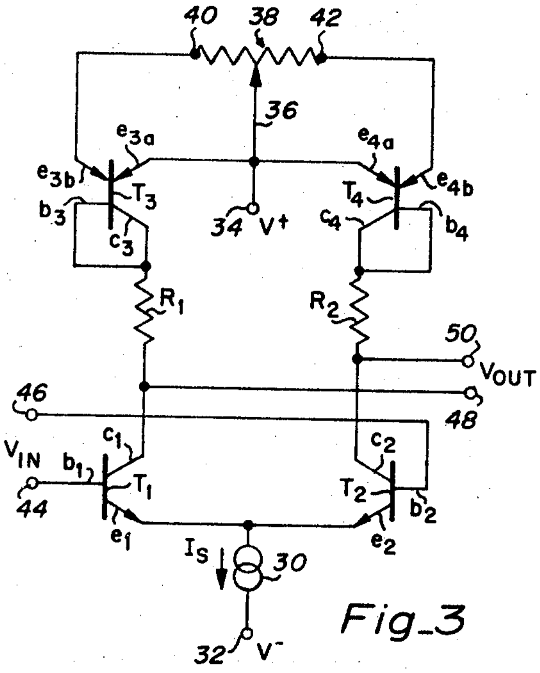
FIG. 3 is a schematic diagram of an alternative embodiment of a differential amplifier in accordance with the present invention.

Similar adjustment of offset potential can be obtained wherein the dual emitter transistors are used as active load devices in a circuit such as that illustrated in FIG. 3 of the drawing. This circuit includes a first NPN amplifying transistor $T_1$, a second NPN amplifying transistor $T_2$, a pair of passive load resistors $R_1$ and $R_2$, and a pair of diode connected dual emitter PNP active load devices $T_3$ and $T_4$. These components are matched as closely as possible so as to insure that any offset potential is small. Such tolerances as 10 mv are well within the capabilities of present IC technology. The collectors $c_1$ of transistor $T_1$ and $c_3$ of Transistor $T_3$ are connected by resistor $R_1$, and the collectors $c_2$ of transistor $T_2$ and $c_4$ of transistor $T_4$ are connected by resistor $R_2$. The emitters $e_1$ of transistor $T_1$ and $e_2$ of transistor $T_2$ are connected together and through the current source 30 to a source of potential V− at terminal 32. The first emitter $e_{3a}$ of dual emitter transistor $T_3$ is coupled to the first emitter $e_{4a}$ of dual emitter transistor $T_4$, to a potential source V+ at terminal 34, and to wiper contact 36 of the potentiometer 38. The second emitter $e_{3b}$ of transistor $T_3$ is coupled to the end 40 of potentiometer 38 and the second emitter $e_{4b}$ of transistor $T_4$ is coupled to the opposite end 42 of potentiometer 38. The bases $b_3$ of transistor $T_3$ and $b_4$ of transistor $T_4$ are connected to their collectors in accordance with conventional diode connection techniques.

The circuit input signal $V_{in}$ is applied across the bases $b_1$ of amplifying transistor $T_1$ and $b_2$ of amplifying transistor $T_2$ at input terminals 44 and 46, and the circuit output $V_{out}$ is taken across the collectors $c_1$ of transistor $T_1$ and $c_2$ of transistor $T_2$ at terminals 48 and 50. The operation of this circuit is similar to that described above with reference to FIG. 1 except that in this case the offset correction is accomplished in the active load devices rather than in the amplifying devices. In this circuit, the current flow through the two circuit branches can be incrementally changed in response to the positioning of wiper contact 36. Although the principles used to effect offset adjustment in this circuit are similar to those described above with regard to FIG. 1, the adjustment occurs in the loads rather than in the amplifying devices. In this embodiment, adjustment of potentiometer 38 can be used to eliminate offset terms caused by mismatch between transistors $T_1$ and $T_2$, resistors $R_1$ and $R_2$ or transistors $T_3$ and $T_4$.

Figure 4:
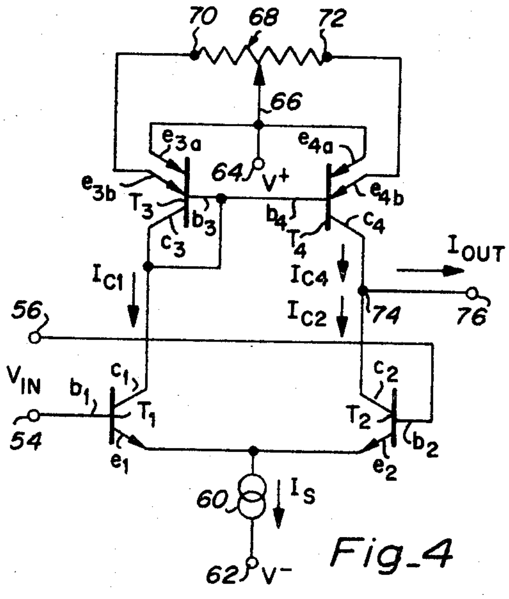
FIG. 4 is a schematic diagram of still another alternative embodiment of a differential amplifier in accordance with the present invention.

Referring now to FIG. 4 of the drawing, a still further embodiment of a differential amplifier utilizing the present invention is illustrated. This single ended embodiment includes a pair of NPN amplifying transistors $T_1$ and $T_2$ which are responsive to an input signal $V_{in}$ applied across input terminals 54 and 56, and a pair of PNP dual emitter transistors $T_3$ and $T_4$. The emitters $e_1$ of transistor $T_1$ and $e_2$ of transistor $T_2$ are coupled together and through a current source 60 to a source of potential V− at terminal 62. The collectors $c_1$ of $T_1$ and $c_2$ of $T_2$ are respectively coupled to the collectors $c_3$ of transistor $T_3$ and $c_4$ of transistor $T_4$, and emitters $e_{3a}$ of $T_3$ and $e_{4a}$ of $T_4$ are connected together, to a source of potential V+ at terminal 64, and to the wiper contact 66 of potentiometer 68. Emitter $e_{3b}$ of $T_3$ is connected to the end 70 of potentiometer 68 and emitter $e_{4b}$ of $T_4$ is connected to the other end 72 of potentiometer 68. The bases $b_3$ of $T_3$ and $b_4$ of $T_4$ are connected together and to collector $c_3$ of $T_3$. With $T_3$ and $T_4$ thus connected, the collector current $I_{c1}$ is, in effect, inverted and reproduced at the collector $c_4$ of $T_4$ in the form of a collector current $I_{c4}$.

Summing the currents at node 74, which is coupled to output terminal 76, it will be noted that the output current $I_{out}$ can be expressed as $$I_{out} = I_{c4} - I_{c2} \quad (13)$$

and since $I_{c4}$ is equal in magnitude to $I_{c1}$, $I_{out}$ is also equal to the difference between $I_{c1}$ and $I_{c2}$. Accordingly, with transistors $T_1$ and $T_2$ matched, transistors $T_3$ and $T_4$ matched, and wiper contact 66 at the electrical center of potentiometer 68, the output current $I_{out}$ will be zero when the input potential $V_{in}$ is zero. More realistically, however, the transistors will not be perfectly matched and since $I_{c4}$ can be forced to differ in either the plus or minus direction from $I_{c1}$ by changing the position of wiper contact 66 of potentiometer 68, it will be seen that an offset term appearing in the output current $I_{out}$ can be balanced out by a simple adjustment of potentiometer 68 as in the previously described embodiments.

A practical example of the utilization of differential amplifier circuits such as those described above may be found in the operational amplifiers designated LM112 and LM212 and manufactured by the National Semiconductor Corporation of Santa Clara, Calif.

Although the present invention has been described in terms of three particular preferred embodiments each using a potentiometer to effect the balancing operation, it is contemplated that the invention may likewise be embodied in other forms. For example, once the value of the balancing impedances required in the extra emitter circuits of the dual emitter transistors have been determined, fixed impedances can be inserted in place of the illustrated potentiometer. It is therefore intended that the disclosed embodiments are by way of illustration only and that the appended claims be interpreted as covering all embodiments which fall within the true spirit and scope of the invention.

What is claimed is:

1. A differential amplifier, comprising:

a first amplifying circuit including a first load impedance and a first transistor having a first base for receiving a first input signal, a first collector coupled to said first load impedance, a first emitter, and a second emitter;

a second amplifying circuit including a second load impedance and a second transistor having a second base for receiving a second input signal, a second collector coupled to said second load impedance, a third emitter coupled to said first emitter, and a fourth emitter;

means for coupling said first and second load impedances to a first potential source, a current source coupled to said first emitter and said third emitter, means for coupling said current source to a second potential source, and a potentiometer including a resistance element having one end coupled to said second emitter and the opposite end coupled to said fourth emitter, and a movable wiper contact coupled to said first and third emitters, whereby the collector currents of said first and second transistors can be varied by adjusting the position at which said wiper contacts said resistance element.

2. A differential amplifier, comprising:

a first transistor having a first base for receiving a first input signal, a first collector, and a first emitter;

a second transistor having a second base for receiving a second input signal, a second collector, and a second emitter coupled to said first emitter;

a third transistor having a third collector coupled to said first collector, a third emitter, and a fourth emitter;

a fourth transistor having a fourth collector coupled to said second collector, a fifth emitter coupled to said third emitter, and a sixth emitter;

said third transistor having a third base coupled to said third collector, and said fourth transistor having a fourth base coupled to said fourth collector, whereby said third and fourth transistors provide active load impedances for said differential amplifier, means for coupling a first source of potential to said third and fifth emitters, a current source coupling said first and second emitters to a second source of potential, and a potentiometer including a resistance element having one end coupled to said fourth emitter, the opposite end coupled to said sixth emitter, and a wiper contact coupled to said third and fifth emitters, whereby an output signal taken across said first and second collectors can be adjusted by changing the contact position of said wiper contact on said resistance element.

3. A differential amplifier as recited in claim 2 and further comprising a first resistive impedance coupling said first collector to said third collector, and a second resistive impedance coupling said second collector to said fourth collector.

4. A differential amplifier, comprising;

a first transistor having a first base for receiving a first input signal, a first collector, and a first emitter;

a second transistor having a second base for receiving a second input signal, a second collector, and a second emitter coupled to said first emitter;

a third transistor having a third collector coupled to said first collector, a third base coupled to said third collector, a third emitter, and a fourth emitter;

a fourth transistor having a fourth collector coupled to said second collector, a fourth base coupled to said third base, a fifth emitter coupled to said third emitter, and a sixth emitter;

means for coupling a first source of potential to said third and fifth emitters, a potentiometer including a resistance element having one end coupled to said fourth emitter, the opposite end coupled to said sixth emitter, and a wiper contact coupled to said third and fifth emitters, whereby an output current taken at said second collector can be adjusted by changing the contact position of said wiper contact on said resistance element, and a current source coupling said first and second emitters to a second source of potential.

* * * * *